(12) United States Patent
Amagai

(10) Patent No.: US 7,786,599 B2
(45) Date of Patent: Aug. 31, 2010

(54) SEMICONDUCTOR DEVICE WITH AN IMPROVED SOLDER JOINT

(75) Inventor: Masazumi Amagai, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/581,254

(22) Filed: Oct. 19, 2009

(65) Prior Publication Data

US 2010/0032840 A1    Feb. 11, 2010

Related U.S. Application Data

(63) Continuation of application No. 11/346,728, filed on Feb. 3, 2006, now Pat. No. 7,626,274.

(51) Int. Cl.
  *H01L 23/48*    (2006.01)
  *H01L 23/52*    (2006.01)
  *H01L 23/40*    (2006.01)

(52) U.S. Cl. .............................. 257/779; 257/E23.021
(58) Field of Classification Search ................. 257/779, 257/781, E23.021
See application file for complete search history.

*Primary Examiner*—David A Zarneke
*Assistant Examiner*—Jenny L Wagner
(74) *Attorney, Agent, or Firm*—Yingsheng Tung; Wade J. Brady, III; Frederick J. Telecky, Jr.

(57) ABSTRACT

A semiconductor device with an improved solder joint system is described. The solder system includes two copper contact pads connected by a body of solder and the solder is an alloy including tin, silver, and at least one metal from the transition groups IIIA, IVA, VA, VIA, VIIA, and VIIIA of the Periodic Table of the Elements. The solder joint system also includes, between the pads and the solder, layers of intermetallic compounds, which include grains of copper and tin compounds and copper, silver, and tin compounds. The compounds contain the transition metals. The inclusion of the transition metals in the compound grains reduce the compound grains size and prevent grain size increases after the solder joint undergoes repeated solid/liquid/solid cycles.

8 Claims, 5 Drawing Sheets

SEMICONDUCTOR DEVICE WITH AN IMPROVED SOLDER JOINT

This application is a continuation of application Ser. No. 11/346,728 filed Feb. 3, 2006, the contents of which are herein incorporated by reference in its entirety.

FIELD OF THE INVENTION

The present invention is related in general to the field of metallurgical systems with application to electronic systems and semiconductor devices, and more specifically to methods for controlling intermetallic grain sizes at the solder joint of semiconductor products.

DESCRIPTION OF THE RELATED ART

When integrated circuits on semiconductor chips are to be interconnected to external circuitry on a substrate using reflow materials such as solder, or when packaged semiconductor chips have to be interconnected to boards using reflow solders, the parts to be assembled have to undergo at least one temperature rise to a temperature above the melting temperature of the reflow material, followed by a cooling cycle. After completing this process, the finished assembly often has to be subjected to annealing steps—repeated temperature swings for an extended period of time. And the assembled parts frequently have to be tested to determine their reliable functioning after repeated exposure to failure-accelerating conditions such as extreme temperature excursions and elevated humidity.

The failure mechanisms studied since the early development of reflow-assembled parts were predominantly stress-induced joint fatigue, creep and cracking. Similarly, stress-initiated failures have been at the center of research attention for complete device packages assembled on external parts using reflow materials such as solder. Little attention has been directed towards the progressive changes in the assembly joints caused by intermetallic effects such as metal interdiffusions, compound formation, and lattice mismatches. These changes are particularly pronounced for certain metals and may be irreversible and may contribute to diminished reliability of finished devices.

In particular, copper pads in direct contact with solder have been found to exhibit weaknesses, especially in mechanical shock ("drop") tests. One solution has been the implementation of a nickel layer as a diffusion barrier between copper and solder to limit the solder reaction. However, the added plating process is not practical for large boards and substrates.

SUMMARY OF THE INVENTION

Applicant recognizes the need for high device reliability, including in drop tests; and studied the interface between copper and binary solder, especially tin/silver alloy, under repeated solid/liquid/solid cycles and under the long term influence of elevated temperatures. This investigation reveals that, under elevated temperature excursions, originally small-grain intermetallic compounds, which include copper, gradually grow into large-grain compounds, and a large amount of Kirkendall voids form at the interface between solder and copper. Both phenomena greatly decrease the interfacial strength of the intermetallic joint and lead to the solder joint cracks observed after drop tests.

Furthermore, applicant found that tin/silver-based ternary solder alloys containing metals from certain transition groups of the Periodic System of the Elements have the ability to replace copper in certain intermetallic compounds, resulting in a reduced and constant intermetallic grain size even after repeated solid/liquid/solid cycles, and a reduced thickness of the intermetallic layer. These effects greatly improve the device reliability in drop tests.

One embodiment of the invention is a metal interconnect structure, in which two copper contact pads are connected by a body of solder. The solder is an alloy that includes tin, silver, and at least one metal from the transition groups IIIA, IVA, VA, VIA, VIIA, and VIIIA of the Periodic Table of the Elements. Between the pads and the solder are layers of intermetallic compounds with grains of copper/tin and copper/silver/tin compounds containing transition metals derived from the solder body. The weight percent of transition metals in the solder regions near the contact pads is less than the weight percent of transition metals in the center regions of the solder body. With the incorporation the transition metals, the compound grains are small and remain small after solid/liquid/solid cycles.

The metals in the transition group IIIA include scandium, yttrium, and lanthanum; in group IVA: titanium, zirconium, and hafnium; in the group VA: vanadium, niobium, and tantalum; in group VIA: chromium, molybdenum, and tungsten; in group VIIA: manganese and rhenium; and in group VIIIA: iron, cobalt, nickel, ruthenium, rhodium, palladium, osmium, iridium, and platinum.

Another embodiment of the invention is a stacked semiconductor device including a first device and a second device. The first device includes a substrate, a semiconductor chip assembled on one substrate surface, and copper contact pads on the opposite substrate surface. The second device includes a substrate, a semiconductor chip assembled on one substrate surface, and copper contact pads surrounding the assembled chip that align with the pads of the first package connected by solder. The second device also has copper contact pads on the opposite substrate surface of the assembled chip.

The bodies of solder are alloys include tin, silver, and at least one metal from the transition groups IIIA, IVA, VA, VIA, VIIA, and VIIIA of the Periodic Table of the Elements. A layer of intermetallic compounds is between each copper pad and solder body. The compounds include grains of copper/tin and copper/silver/tin compounds, which contain transition metals from the solder body. Consequently, the transition metal weight percent in the solder regions near the contact pads is less than the weight percent in the center regions of the solder body. The compound grains that include transition metals have small grain size and stay small after solid/liquid/solid cycles; the invention thus produces semiconductor devices, such as package-on-package stacked devices, which exhibits much reduced failure rates in reliability tests, such as the drop tests.

Another embodiment of the invention is an electronic system, which has a stacked device soldered on the copper contact pads of a circuit board. The system also has a second stacked device with pads aligned to the board pads and bodies of alloy solder connect the aligned pads. The alloy has at least one metal from the transition groups listed above. Again, there are layers of intermetallic compound between the pads and the solder bodies that incorporate transition metals in grains. The incorporation reduces the compound grain sizes formed after solder reflow, as well as the compound layer thickness, and renders the compound grain size reproducibly small after repeated solid/liquid/solid cycles, resulting in much improved system reliability performance.

The technical advances represented by certain embodiments of the invention will become apparent from the following description of the preferred embodiments of the inven-

BRIEF DESCRIPTION OF THE DRAWINGS

In FIG. 1, one contact pad is made of a single metal layer; one contact pad is made of a sandwich of layers.

FIGS. 2A to 7D are magnified microphotographs of intermetallic compound grains; FIGS. 2A, 3A, 4A, 5A, 6A, 7A, 2C, 3C, 4C, 5C, 6C, and 7C are top views, and FIGS. 2B, 3B, 4B, 5B, 6B, 7B, 2D, 3D, 4D, 5D, 6D, and 7D are cross sections.

FIGS. 2A, 2B, 2C, and 2D display $Sn_3Ag$.
FIGS. 3A, 3B, 3C, and 3D display $Sn_3AgCu$.
FIGS. 4A, 4B, 4C, and 4D display $Sn_3Ag_{0.01}Ni$.
FIGS. 5A, 5B, 5C, and D5 display $Sn_3Ag_{0.03}Ni$.
FIGS. 6A, 6B, 6C, and 6D display $Sn_3Ag_{0.03}Co$.
FIGS. 7A, 7B, 7C, and 7D display $Sn_3Ag_{0.1}Zn$.

DETAILED DESCRIPTION OF THE PREFERRED EMBODIMENTS

Figure 1:
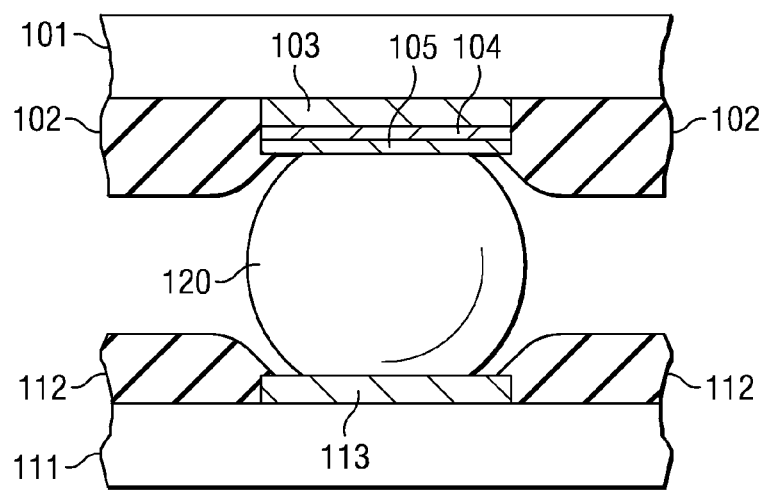
FIG. 1 is a schematic cross section of metal interconnect structure between two contact pads.
Figure 2A:
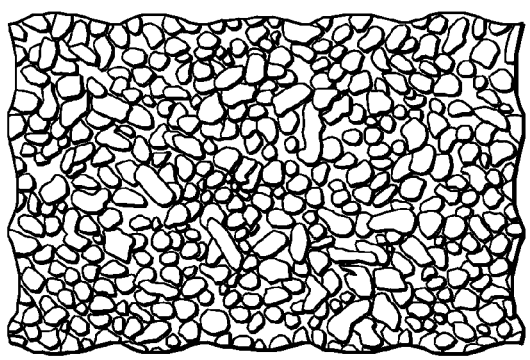
Figure 2C:
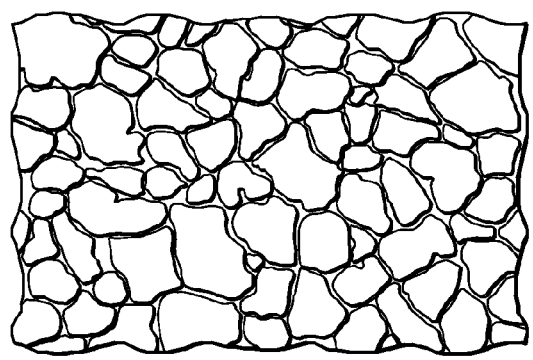
Figure 2B:
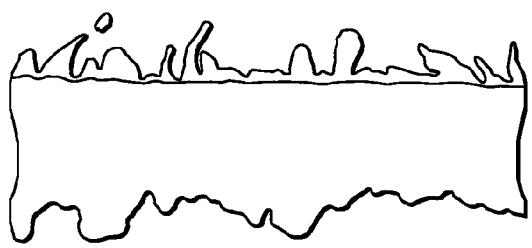
Figure 2D:
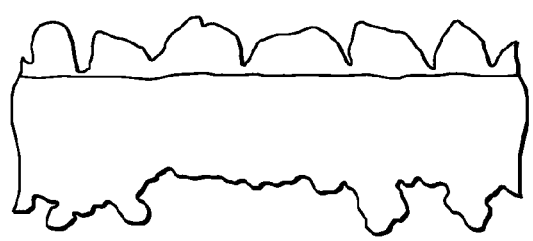
Figure 3A:
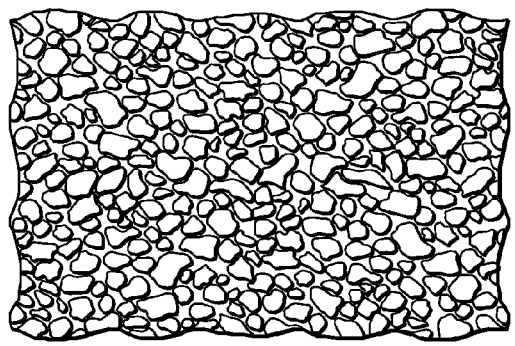
Figure 4A:
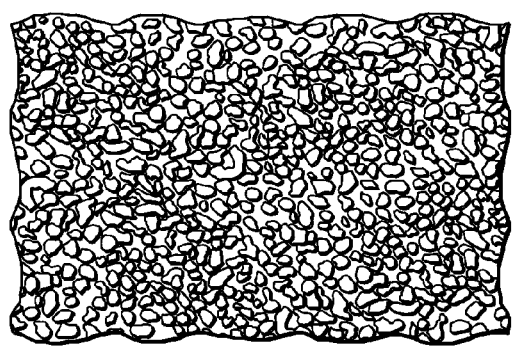
Figure 3B:
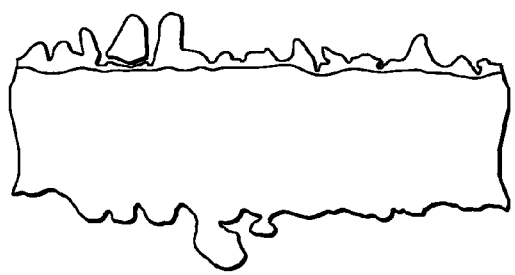
Figure 4B:
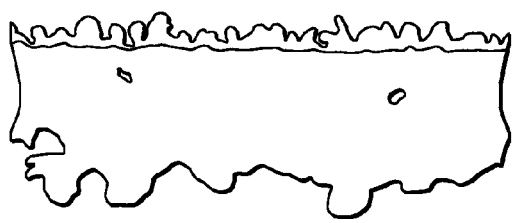
Figure 3C:
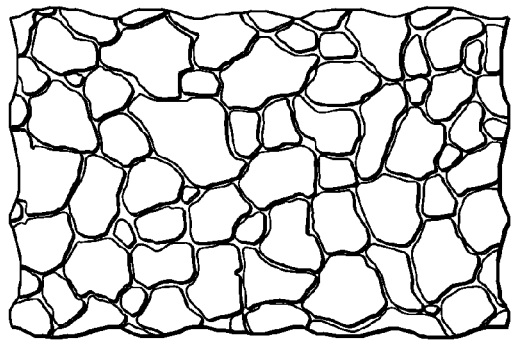
Figure 4C:
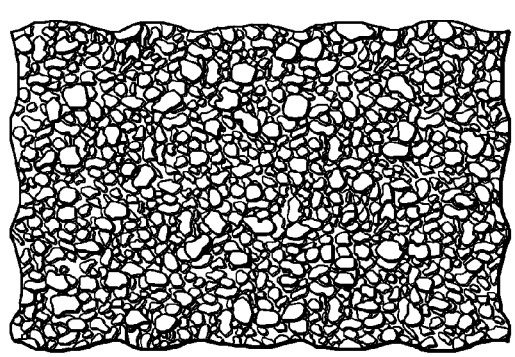
Figure 3D:
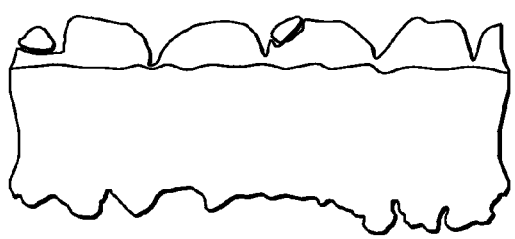
Figure 4D:
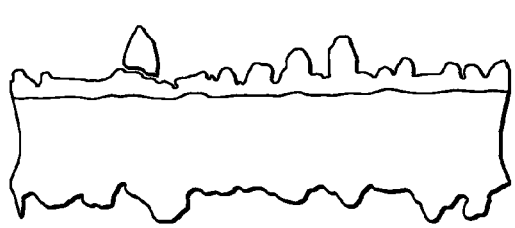
Figure 5A:
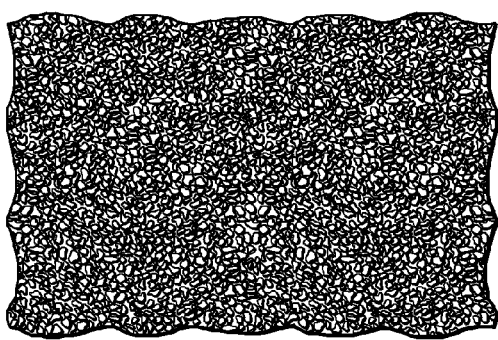

FIG. 1 depicts schematically a metal interconnect structure Element 101 designates a first substrate made of an insulating substrate, a circuit board, or a semiconductor material. The substrate surface is covered by an insulating material 102, such as a protective overcoat (for example, silicon dioxide, silicon nitride, or polyimide) or a solder mask; the thickness is preferably between about 20 to 40 µm. In overcoat 102 is a window, which exposes a metallic contact pad 103. The preferred metal for contact pad 103 is copper or a copper alloy in the thickness range from about 10 to 30 µm.

Element 111 designates a second insulating substrate, a second circuit board, or a second semiconductor material. Its surface is covered by some insulating, protective material 112, which has a window to expose a second metallic contact pad 113. The preferred metal for contact pad 113 is copper or a copper alloy in the thickness range from about 10 to 30 µm.

In a variation to FIG. 1, the first contact pad 103 may have over the copper surface barrier metal layers 104 and 105. Preferably, layer 104 is made of nickel in the thickness range from about 0.01 to 3 µm, and layer 105 is made of gold in the thickness range from about 0.3 to 1 µm. In another variation, the second copper contact pad 113 may have on it a barrier layer, preferably made of 0.01 to 3 µm thick nickel, followed by layer, preferably made of 0.3 to 1 µm gold.

In FIG. 1, the second contact pad is positioned opposite the first contact pad. A body 120 of solder is in contact with the first and second pad, thus connecting the two pads. The solder of body 120 is an alloy, which includes the following metals:

Tin in the amount of about 95.5 to about 99.49 weight percent; silver in the amount of about 0.5 to about 4.0 weight percent; and at least one metal from the transition groups IIIA, IVA, VA, VIA, VIIA, and VIIIA of the Periodic Table of the Elements in the amount of about 0.01 to about 0.5 weight percent.

As an incoming piece part, the original solder body exhibits a substantially uniform distribution of the constituents of the alloy. After solder reflow, however, the transition metal weight percent in the solder regions near the contact pads is less than that of the transition metal weight percent in the center regions of the solder body, in certain structures, by more than half.

The metals in the transition group IIIA include scandium, yttrium, and lanthanum; the metals in the transition group IVA include titanium, zirconium, and hafnium; the metals in the transition group VA include vanadium, niobium, and tantalum; the metals in the transition group VIA include chromium, molybdenum, and tungsten; the metals in the transition group VIIA include manganese and rhenium; and the metals in the transition group VIIIA include iron, cobalt, nickel, ruthenium, rhodium, palladium, osmium, iridium, and platinum.

When solder body 120 is liquefied and then solidified to be attached to the contact pad 103, a layer of intermetallic compounds forms between the pad 103 and the solder 120. The compounds, as will be shown in the following figures, include grains of copper/tin and copper/silver/tin compounds, such as $(CuX)_6Sn_5$, $Sn_3Ag$, and $Ag_3Sn$, wherein X is a transition metal from the solder body. The inclusion of the transition metals in the compound grains reduces the compound grain size and the compound layer thickness. Furthermore, in repeated cycles of liquefying and solidifying, the compound grains that include the transition metals remain reproducible, which means, the grains sizes do not grow significantly after repeated solid/liquid/solid cycles.

When solder body 120 is again liquefied and then solidified in order to be attached to the second contact pad 113, another layer of intermetallic compounds forms between the second pad and the solder. The compounds again include tin/silver, copper/tin and copper/silver/tin compounds, and the incorporation of the transition metals again reduces the compound grain size and the compound layer thickness. Further, the grain sizes remain reproducible.

One possible explanation of this phenomenon is that when atoms of the transition metals are joining an intermetallic grain, they replace atoms in the compound grain, for instance copper atoms in compounds containing copper. In this metallic binding process, the transition metals contribute one or more of their electrons to the electron "gas" in the metal; as a consequence, the attractive force of their nucleus becomes stronger and the diameter of the metal atom decreases as a result. The TABLE in the appendix displays the metals in the transition groups of the Periodic System of the Elements and the incomplete electron shells and the number of potentially contributable electrons.

Microphotographs of exemplary compounds of applicant's experiment are reproduced in the Figures, which show: a top view microphotograph after compound formation (first solder reflow), magnification 2000×; a cross section of the compound to show the layer of intermetallic compounds, 3000×; a top view microphotograph of the intermetallic compound after four solder reflows, magnification 2000×, and a cross section showing the layer of intermetallic compounds, 3000× after the reflows. To obtain the top views of the compound layers, the solder was first removed by sanding, then the surfaces were etched by chemical (Meltex HN-980M) and cleaned with ultrasonic cleaning.

FIG. 2 illustrates the intermetallic compound $Sn_3Ag$ formed with tin/silver solder without incorporating transition metals. Comparing the compound grains after only 1 reflow, FIGS. 2A and 2B, and the compound grains after 4 reflows, 2C and 2D, it is evident that there is a significant increase in grain size in proportion to the number of reflows. Since this increasing of intermetallic compound grain size leads to a mechanical weakening of the solder joint, these results indicate that devices, which use such intermetallic compounds, are more likely to fail reliability tests such as the drop test.

FIGS. 3A, 3B, 3C, and 3D depict the intermetallic compound $Sn_3AgCu$. Comparing the compound grains after only 1 reflow, 3A and 3B, and the compound grains after 4 reflows, 3C and 3D, it is evident that there is a significant increase in grain size after the reflows—a result with undesirable consequences from a device reliability standpoint. Related compounds such as $Sn_3Ag_{0.7}Cu$, $Sn_3Ag_{0.5}Cu$, $Sn_3Ag_{0.3}Cu$, and $Sn_3Ag_{0.1}Cu$ showed similarly undesirable grain size increases after repeated solid/liquid/solid solder cycles.

Forming a uniform ternary alloy by adding, for instance, nickel—a metal of the transition group VIIIA, leads to the exemplary compound $Sn_3Ag_{0.01}Ni$ displayed in FIGS. 4A, 4B, 4C, and 4D. Comparing the intermetallic compound in FIGS. 4A and 4B, with the tin/silver compound in FIGS. 2A and 2B, and the tin/silver/copper compound in FIGS. 3A and 3B, it clearly shows that the addition of nickel reduces the size of the intermetallic grain. The comparison of FIGS. 4C and 4D with FIGS. 2C, 2D and 3C, 3D further highlights the fact that repeated reflow cycles have little effect on the transition-metal compound grain size; it increases only insignificantly after 4 solid/liquid/solid cycles. This stability of the intermetallic compound grain size leads the enhancement of the mechanical strength of solder joints. Devices with solder joints having such intermetallic compounds more likely will pass reliability tests such as the drop test.

The ternary compound $Sn_3Ag_{0.03}Ni$ illustrated in FIG. 5 carries the beneficial effects of the nickel addition one step further. Comparing FIG. 5 with FIG. 4 shows that the compound grain size of $Sn_3Ag_{0.03}Ni$ is even smaller and does not change or increase after four or more reflow cycles. The trend to smaller grin size and cycle insensitivity continues with the ternary compound $Sn_3Ag_{0.05}Ni$.

Another exemplary transition group VIIIA is Platinum and a corresponding intermetallic compound is $Sn_3Ag_{0.05}Pt$.

Figure 6A:
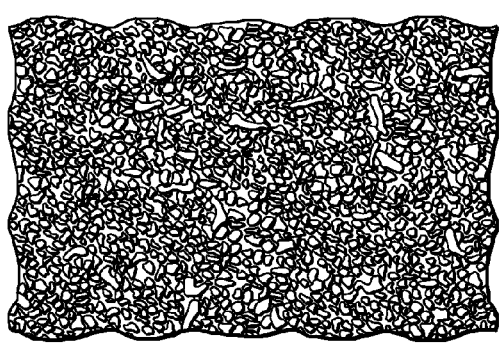
Figure 5B:
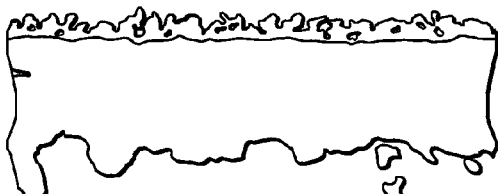
Figure 6B:
Figure 5C:
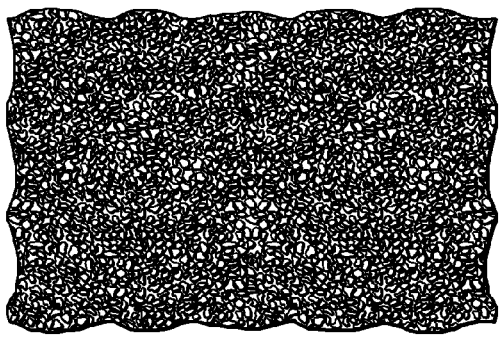
Figure 6C:
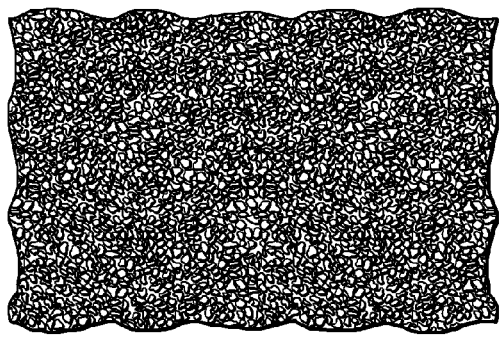
Figure 5D:
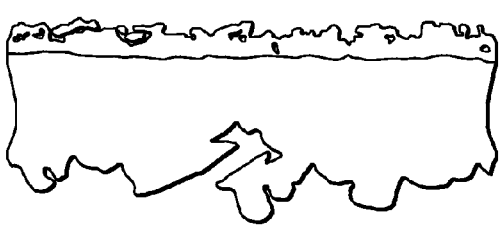
Figure 6D:
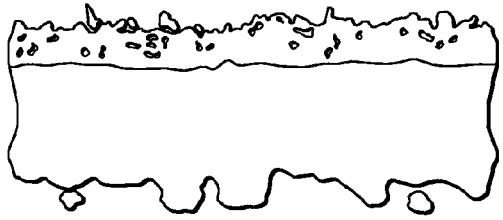
Figure 7A:
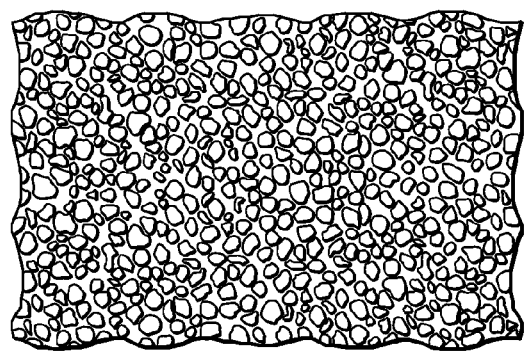
Figure 7B:
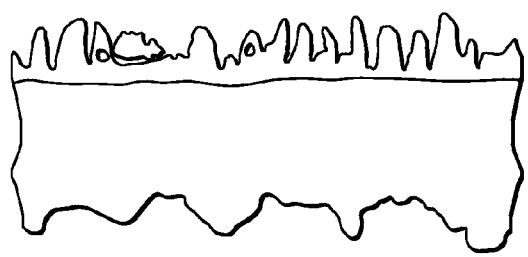
Figure 7C:
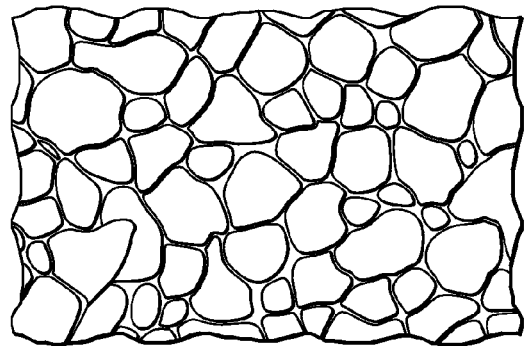
Figure 7D:
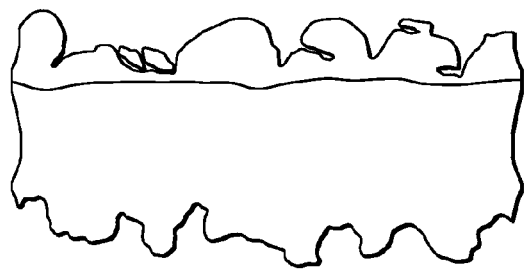

An exemplary transition group VIIA metal is cobalt and FIGS. 6A, 6B, 6C, and 6D illustrate the desirable effect obtained by the incorporating cobalt in the intermetallic compound formed at the interface of tin/silver alloy and the copper pad. As FIGS. 6A and 6B shows, the size of the resulting $Sn_3Ag_{0.03}Co$ grain is small. Furthermore, repeated reflow cycles do not cause any significant change of the grain size, as illustrated by the grain microphotographs in FIGS. 6C and 6D after 4 solid/liquid/solid cycles.

Applicant also investigated counter-examples, especially alloys containing one or more metals from the transition groups IB, IIB, IIIB, IVB, and VB.

As an example, FIGS. 7A, 7B, 7C, and 7D illustrate the impact by the element zinc from the transition group IIB. The compound displayed is $Sn_3Ag_{0.1}Zn$; similar results hold for $Sn_3Ag_{0.005}Zn$. Comparing the compound grains after only 1 reflow, 7A and 7B, and the compound grains after 4 reflows, 7C and 7D, it is evident that there is a significant increase in grain size in after the reflows.

As stated above, a significant increase of the intermetallic compound grain size after repeated solid/liquid/solid solder cycles leads to mechanical weakening of the solder joint, resulting in high failure rates in device reliability tests. A possible explanation for the unfavorable results using transition metals of the groups IIB, IIIB, IVB, and VB is the tendency of elements with a high number of electrons in the unfilled shell to add electrons for completing the shell rather than releasing electrons to the electron "gas" in the metal. By adding electrons, the attractive force of the metal nucleus becomes weaker and causes an increase of the diameter of the metal atom. The atomic diameter increase, in turn, causes an increase of the intermetallic compound, which has incorporated the transition metal.

Similarly undesirable results were obtained from applicant's experiments when ternary solder alloys contain a metal from the group IIIB, such as aluminum or indium. Exemplary intermetallic compounds are $Sn_3Ag_{0.005}Al$, $Sn_3Ag_{0.1}In$, $Sn_3Ag_{0.2}In$, and $Sn_3Ag_{0.3}In$.

Large intermetallic compound increases after repeated reflow cycles were also observed for group IVB element germanium and corresponding compound $Sn_3Ag_{0.05}Ge$, group VB element phosphorus and corresponding compound $Sn_3Ag_{0.003}P$, and group VB element antimony and corresponding compound $Sn_3Ag_{0.3}Sb$ and $Sn_3Ag_{0.5}Sb$.

Another embodiment of the invention is a stacked semiconductor device that includes multiple unit devices. One exemplary device 800 is depicted schematically in FIG. 8. The bottom device, also referred to as the first device, is designated 810, and the top device, also referred to as the second device, is designated 820.

First device 810 includes a substrate 801, which has a first surface 801a and a second surface 801b. Substrate 801 is preferably made of an insulating material; it may also be a laminated substrate composed of alternating films of insulating and conducting materials. For many device applications, the preferred thickness of substrate 801 is approximately 0.3 mm. On the first substrate surface 801a is a semiconductor chip 802 assembled; more than one chip may be so assembled. In some products, the chip may be a stack of two or more chips. For wire-bonded devices, the assembly includes the attachment of the chip to first surface 801a using an adhesive, and the electrical connection 804 of the chip contact pads to the bond pads 805 on surface 801a. For flip-chip devices, the assembly includes the mechanical and electrical connection of the chip to contact pads to surface 801a using solder elements.

Figure 8:
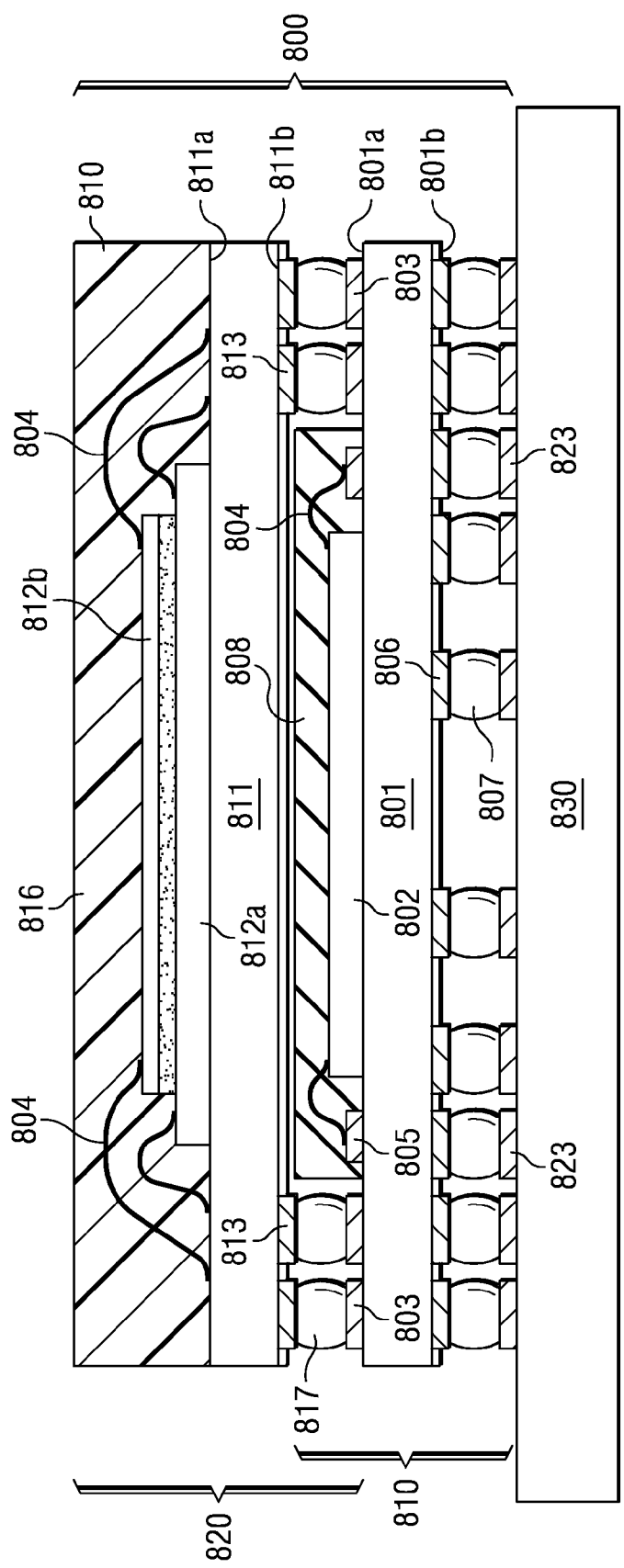
FIG. 8 is a schematic cross section of an electronic system including stacked semiconductor devices assembled on a circuit board.

A first plurality (for instance: 140 to 160) of copper contact pads 803 is positioned on the first substrate surface 801a to surround the assembled chip. A second plurality (for instance: 440 to 460) of copper contact pads 806 is on the second substrate surface 801b. A solder body 807 (for instance, 30 µm diameter) is attached to each pad 806 of the second plurality of pads. In FIG. 8, portions of the assembled device are packaged in encapsulation 808. When only one chip is used for device 810, the total thickness of the packaged device, including solder elements 807, is preferably about 0.8±0.1 mm.

FIG. 8 shows a second device 820 that includes a substrate 811 with first surface 811a and second surface 811b. For many device applications, the preferred thickness of substrate 811 is approximately 0.3 mm. In FIG. 8A a stack of two semiconductor chips 812a and 812b are depicted as assembled on the first substrate surface 811a. On the second substrate surface 811b are copper contact pads 813 positioned to match the first pad plurality 803 of the first device 810. A solder body 817 is attached to each pad 813 on the second substrate surface. In FIG. 8, portions of the assembled device are packaged in encapsulation compound 816. When two chips are used for device 820, the total thickness of the packaged device, including solder elements 817, is preferably about 0.9±0.1 mm.

The second device 820 is aligned with the first device 810 so that each solder body 817 attached to a second substrate pad 813 of the second device 820 is in contact with, and connected to, the corresponding pad 803 of the first plurality of the first device 810.

The solder bodies 807 and 817 in this exemplary embodiment are ternary alloys, which include tin in the amount of about 95.5 to about 99.49 weight percent; silver in the amount of about 0.5 to about 4.0 weight percent; and one metal from the transition groups IIIA, IVA, VA, VIA, VIIA, and VIIIA of the Periodic Table of the Elements in the average amount of about 0.01 to about 0.5 weight percent; more than one transition metal may be included in the alloy. After reflow, the weight percent of the transition metal in the solder regions near the contact pads is less than the weight percent in the center regions of the solder body, by one half, in many cases.

The metals in the transition group IIIA include scandium, yttrium, and lanthanum; the metals in the transition group IVA include titanium, zirconium, and hafnium; the metals in the transition group VA include vanadium, niobium, and tantalum; the metals in the transition group VIA include chromium, molybdenum, and tungsten; the metals in the transition group VIIA include manganese and rhenium; and the metals in the transition group VIIIA include iron, cobalt, nickel, ruthenium, rhodium, palladium, osmium, iridium, and platinum.

A layer of intermetallic compounds forms between each copper pad and solder body after a reflow; the compounds include grains of copper/tin and copper/silver/tin compounds, such as $Sn_3Ag$, $Ag_3Sn$, $(CuX)_6Sn_5$ and others, wherein X is a transition metal from the solder body. The compounds and the grains are formed, when, in the process of attaching, the solder bodies are liquefied and then solidified.

For the stacked device shown in FIG. 8, at least three solid/liquid/solid cycles may be needed. They include attaching solder elements 817 onto substrate pads 813 of second device 820 (a process step in the fabrication method of second device 820) and attaching second device 820 onto first device 810 by reflowing solder bodies 817 a second time. Solder bodies 817 of the second device are aligned with the matching substrate pads 803 of the first device, and brought into contact with pads 803 and reflowed.

In this process embodiment, the stacked device 800 is created by joining first device 810 and second device 820, and attaching solder elements 807 onto the substrate pads 806 of first device 810 (a process step in the fabrication method of first device 810).

In these three solid/liquid/solid cycles, the solder bodies of the second device undergo three reflow processes.

When the transition metals mentioned above are incorporated in the compound grains, they reduce the compound grain size and thus the compound layer thickness; they also render the compound grain size reproducible in consecutive solder solid/liquid/solid cycles.

When devices like the stacked semiconductor device of FIG. 8 are subjected to reliability tests such as the drop test, which investigates the mechanical robustness of solder-attached devices, the devices with solder joints including transition metals in the intermetallic compounds exhibit superior performance. The small-size grains of intermetallic compounds, reproducible even after repeated solid/liquid/solid cycles, inhibit cracks of the joints or other solder delaminations.

In typical drop tests, the drop table is loaded to 1.5 G acceleration, the drop height is 1 m, and the printed circuit board is subjected to a strain with damped waveform for a duration of 30 ms and more. Drop test equipment is commercially available, for instance from Salon Teknopaja.

One exemplary method for fabricating a stacked semiconductor device includes the following steps:

a. fabricating a first semiconductor device by providing a substrate having two surfaces, assembling a semiconductor chip or multiple chips on the first substrate surface; surrounding the chip with a first plurality of copper contact pads, and forming a second plurality of copper contact pads on the second substrate surface;

b. fabricating a second semiconductor device by providing a substrate with two surfaces, assembling one or more semiconductor chip on the first substrate surface; positioned on the second substrate surface copper contact pads to match the pads of the first device;

c. selecting solder bodies that are substantially uniform alloys including tin in the amount of about 95.5 to about 99.49 weight percent, silver in the amount of about 0.5 to about 4.0 weight percent, and at least one metal from the transition groups IIIA, IVA, VA, VIA, VIIA, and VIIIA of the Periodic Table of the Elements in the amount of about 0.01 to about 0.5 weight percent; and d. attaching and reflowing the solder bodies to the pads on the second substrate surface to create between each copper pad and solder body a layer of copper intermetallic compounds that incorporate the transition metal form the solder body;

e. aligning the second device with the first device so that each solder body, attached to a second substrate pad of the second device, is in contact with the corresponding first plurality pad of the first device; and f. reflowing the solder bodies to attach an alloy solder body to each second plurality pad of the first device.

Another embodiment of the invention is an electronic system, which includes a device mounted on a substrate or board. FIG. 8 depicts such an embodiment, in which the stacked device 800 is solder-attached on the printed circuit board 830. The circuit board 830 has copper contact pads 823 positioned to match the second plurality 806 of contact pads on the substrate of the first device 810. In the fabrication process of the system, the stacked semiconductor device 800 is aligned with circuit board 830 so that each solder body 807, attached to the second plurality pad 806 of first device 810, is in contact with the corresponding board pad 823. The solder bodies 807 are then reflowed.

The attachment cycle is the fourth solid/liquid/solid cycle and thus maybe the third reflow cycle for some solder elements in the system. Having transition metals from the above listed groups in the intermetallic grains of the solder system makes the electronic system more likely to pass drop tests and other reliability tests with acceptable rate of failure.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, more than two devices may be stacked to create a composite device. As another example, more than one metal from the transition groups of the Periodic System of the Elements may be used in the solder alloy, creating a quaternary alloy etc. It is therefore intended that the appended claims encompass any such modifications or embodiments.

I claim:

1. A semiconductor device, comprising:
a first semiconductor device including a semiconductor chip and a first contact pad with a copper surface;
a second semiconductor device including a semiconductor chip and a second contact pad with a copper surface opposite the first contact pad; and
a body including a solder alloy in contact with the first contact pad and the second pad, the solder alloy including:

tin of a first weight percent;

silver of a second weight percent; and at least one metal from the transition groups IIIA, IVA, VA, VIA, VIIA, and VIIIA of the Periodic Table of the Elements of a third weight percent greater than zero percent near the first contact pad and the second contact pad, and a fourth weight percent higher than the third weight percent near the center of the solder body.

2. The semiconductor device according to claim 1, in which the transition metal is cobalt.

3. The semiconductor device according to claim 1, further comprising a first layer of intermetallic compounds between the first pad and the solder body, and a second layer of intermetallic compounds between the second pad and the solder body, the intermetallic compounds include Sn3Ag, Ag3Sn, and (CuX)6Sn5, wherein X is the transition metal.

4. The semiconductor device according to claim 1 further comprising one or more barrier metal layers other than copper over at least one of the copper contact pads.

5. The semiconductor device according to claim 4 wherein the barrier metal layers in contact with the copper pad include a nickel layer and a gold layer.

6. The semiconductor device according to claim 1, wherein the at least one semiconductor device include a stack of semiconductor chips.

7. The semiconductor device according to claim 1, wherein the layers of intermetallic compound further comprises grains of copper.

8. The semiconductor device according to claim 1, wherein the third weight percent and the fourth weight percent being in the amount of about 0.01 to about 0.5.

* * * * *